US008320587B2

(12) United States Patent
Dai et al.

(10) Patent No.: US 8,320,587 B2
(45) Date of Patent: Nov. 27, 2012

(54) AUDIO DEVICE AND VOLUME ADJUSTING CIRCUIT FOR THE AUDIO DEVICE

(75) Inventors: Lung Dai, Taipei Hsien (TW); Shao-Lin Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 547 days.

(21) Appl. No.: 12/487,647

(22) Filed: Jun. 18, 2009

(65) Prior Publication Data

US 2009/0316931 A1 Dec. 24, 2009

(30) Foreign Application Priority Data

Jun. 19, 2008 (CN) .......................... 2008 1 0302221

(51) Int. Cl.
*H03G 3/00* (2006.01)
*H04R 29/00* (2006.01)

(52) U.S. Cl. ........... 381/107; 381/104; 381/105; 381/59

(58) Field of Classification Search .................... 381/59, 381/77, 86–87, 118, 302, 336, 386, 104–109
See application file for complete search history.

(56) References Cited

U.S. PATENT DOCUMENTS

| | | | |
|---|---|---|---|
| 6,661,287 B2 | 12/2003 | Lin et al. | |
| 2004/0151336 A1* | 8/2004 | Han et al. | 381/370 |
| 2008/0205663 A1* | 8/2008 | Crump et al. | 381/71.6 |

FOREIGN PATENT DOCUMENTS

CN 2726214 Y 9/2005

* cited by examiner

*Primary Examiner* — Yuwen Pan
*Assistant Examiner* — George Monikang
(74) *Attorney, Agent, or Firm* — Altis Law Group, Inc.

(57) ABSTRACT

An audio device includes an internal sound producer, an earphone jack, a detection circuit, a volume adjustor, and an amplifier. The detection circuit detects a connection between the earphone jack and an external sound producer, generates a first state signal when the connection is established, generates a second state signal when no connection is established. The volume adjustor is preset with first predetermined volume levels and second predetermined volume levels, generates first adjustment signals based on the first predetermined volume levels in response to the first state signal, and generates a second adjustment signal based on the second predetermined volume levels in response to the second state signal. The amplifier amplifies audio signals and adjusts the volume of the amplified audio signals according to the adjustment signals, then sends the amplified audio signals to the internal sound producer and earphone jack.

11 Claims, 4 Drawing Sheets

AUDIO DEVICE AND VOLUME ADJUSTING CIRCUIT FOR THE AUDIO DEVICE

BACKGROUND

1. Technical Field

The present disclosure relates to audio devices, and more particularly to volume adjusting circuit for the audio devices.

2. Description of related art

Audio devices, such as CD/DVD players, MP3 (MPEG-1 audio layer III) players, and MP4 (MPEG-4) players are widely used. A typical audio device generally has an internal speaker and an earphone plug detachably connecting with a jack. Thus, the audio device can selectively output sound to the internal speaker or to the earphones that is external to the audio device.

Normally, volume of a speaker is much higher than that of an earphone due to the sizes thereof. Therefore, when the internal speaker is selected to output sound, the volume of the audio device needs to be high. On the other hand, when the earphone is selected as an output, the volume of the audio device needs to low. The volume of the audio device needs to, accordingly, be adjusted. A conventional method for adjusting the volume consults a list of predetermined volume levels. Each volume level has a gain indicating an adjustable volume range. However, the suitable volume levels for the internal speaker and the external earphone are different. It is inconvenient for users to adjust the volume of the other sound producer to a perfect value.

Therefore, it is desirable to provide an audio device and a volume circuit thereof overcoming the described shortcomings and deficiencies.

DETAILED DESCRIPTION

Figure 1:
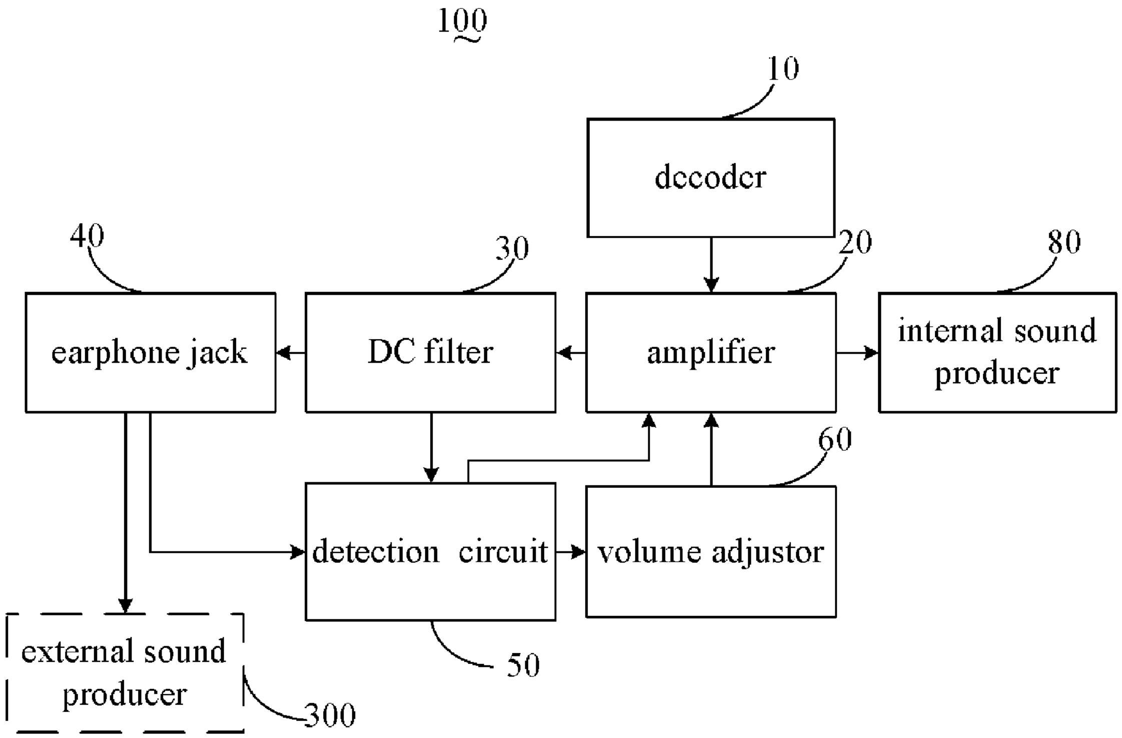
FIG. 1 is a block diagram of a first embodiment of an audio device.

Referring to FIG. 1, a block diagram of a first embodiment of an audio device is shown. The audio device 100 includes a decoder 10, an amplifier 20, a direct circuit (DC) filter 30, an earphone jack 40, a detection circuit 50, a volume adjustor 60, and an internal sound producer 80. The decoder 10 is configured for reproducing audio signals from audio or other files stored in a medium such as an optical disc. The audio signals are alternating current (AC) signals and may include noise, such as DC signals. The amplifier 20 is electrically connected to the decoder 30 for receiving the audio signals from the decoder 30 and amplifying the audio signals. The amplifier 20 is also electrically connected to the DC filter 30 and the internal sound producer 80. The DC filter 30 is electrically connected to the earphone jack 40. The amplified audio signals are thus output to the internal sound producer 80 or an external sound producer 300 attached to the earphone jack 40. The internal sound producer 80 is an internal speaker. The external sound producer 300 is an external earphone or other sound producer.

The detection circuit 50 is electrically connected to the DC filter 30, the earphone jack 40, the amplifier 20, and the volume adjustor 60. The detection circuit 50 is configured for detecting a connection between the earphone 300 and the earphone jack 40, generating a first signal such as a high voltage when the connection is detected, and a second signal such as a low voltage signal when no connection is detected. The first state signal and the second state signal are transmitted to the volume adjustor 60 and the amplifier 20. The amplifier 20 transmits the audio signal to the external earphone 300 but not to the internal speaker 80 when receiving the second state signal, and transmits the audio adjustment signals to the internal speaker 80 when receiving the first state signal.

The volume adjustor 60 is electrically connected to the amplifier 20 and the detection circuit 50 for controlling the amplifier 20 based on the received state signals from the detection circuit 50. The volume adjustor 60 stores a first table listing first predetermined volume levels suitable for the earphone 300 and a second table listing second predetermined volume levels suitable for the internal speaker 80. The volume adjustor 60 is capable of generating a first adjustment signal based on the first predetermined volume levels when receiving the first state signal, and generating a second adjustment signal based on the second predetermined volume levels when receiving the second state signal. The first adjustment signal and the second adjustment signal are then transmitted to the amplifier 20. For example, the first predetermined volume levels and the second predetermined levels both have N volume levels V0~Vn. Each volume level has a gain indicating the adjustable volume range. The gains of the volume levels V0~Vn of the first predetermined volume levels is lower than that of the volume levels V0~Vn of the second predetermined volume levels accordingly. If the level V0 of the first volume levels is lower than the level V0 of the second predetermined volume, volume adjustor 60 selects one of the first predetermined volume levels by default to generate the first adjustment signal based on the selected volume level when receiving the first state signal. The gain of the selected volume level is set according to a target volume value for the earphone 300. Otherwise, the volume adjustor 60 selects one of the second predetermined volume levels by default to generate the second adjustment signal based on the selected volume level when receiving the second state signal. The gain of the selected volume level is set according to a target volume value for the internal speaker 80.

The amplifier 20 further adjusts the volume of the amplified audio signals to a desired level based on the received adjustment signal from the volume adjustor 60, and transmits the adjusted audio signals to the internal speaker 80 or the external earphone 300 based on received state signals. The amplifier 20 adjusts the volume according to the first predetermined volume levels when receiving the first adjustment signal, and adjusts the volume according to the second predetermined volume levels when receiving the second adjustment signal.

Figure 2:
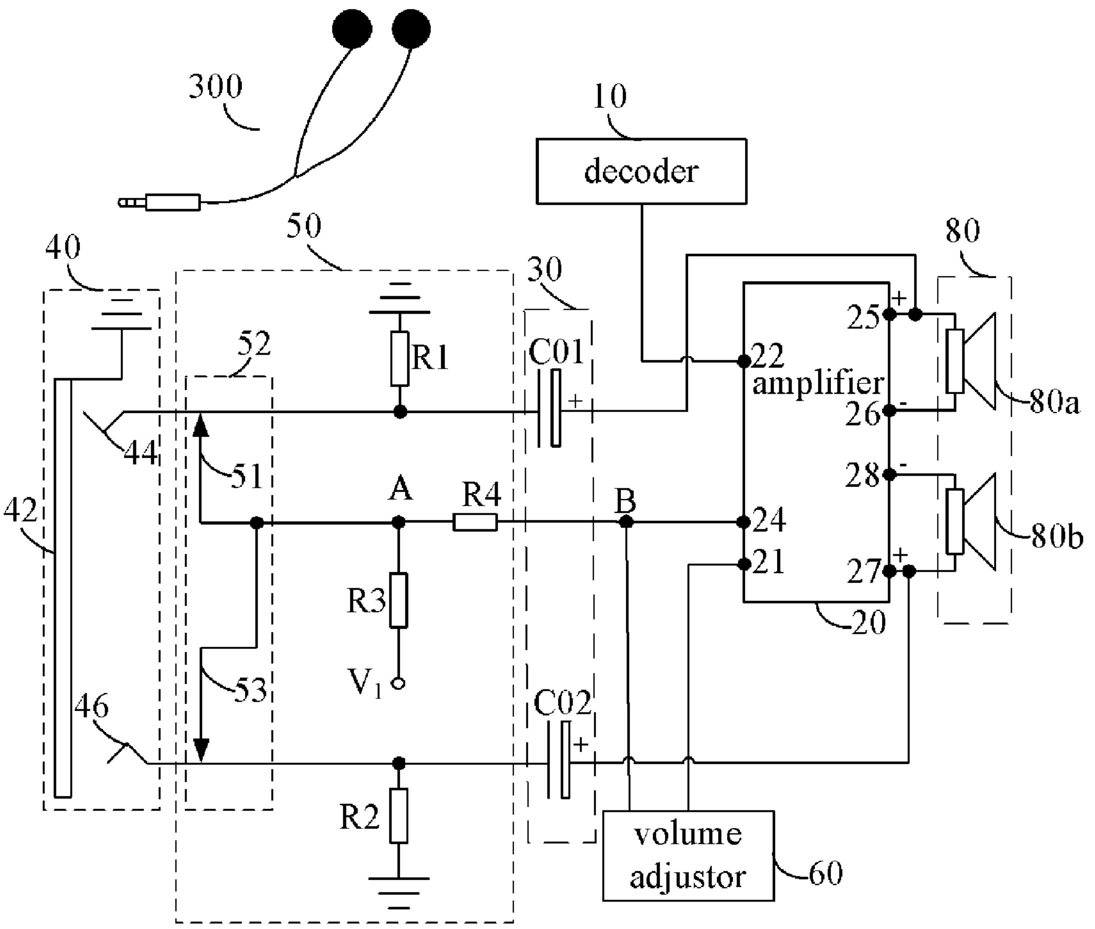
FIG. 2 shows a first embodiment of a volume circuit for an audio device, such as, for example, that of FIG. 1.

FIG. 2 shows a first embodiment of a volume circuit for an audio device. An amplifier 20 includes a volume adjustment terminal 21, an input terminal 22, a control terminal 24, a pair of positive output terminals 25, 27, and a pair of negative output terminals 26, 28. The input terminal 22 is electrically connected to the decoder 10, the control terminal 24 is electrically connected to the detection circuit 50, and the volume adjustment terminal 21 is electrically connected to the volume adjustor 60. As a result, the amplifier 20 receives the audio signals from the decoder 10 via the input terminal 22, receives the state signals from the detection circuit 50 via the control terminal 24, and receives the adjustment signals from the volume adjustor 60 via the volume adjustment terminal 21. The amplifier 20 amplifies the audio signals and adjusts the volume of the amplifier audio signal based on the adjustment signals, and then outputs the adjusted audio signals via the positive output terminals 25, 27 and the negative output terminals 26, 28. In this embodiment, the output amplified audio signals are in a normal phase when the amplifier 20 receives the high voltage (the first state signal). The amplified audio signals output via the positive output terminals 25, 27 are in normal phase, and the amplified audio signals output via negative output terminals 26, 28 are in reverse phase when the amplifier 20 receives the low voltage (the second state signal).

The DC filter 30 includes two electrolytic capacitors C01, C02. Positive pins of the two electrolytic capacitors C01, C02 are electrically connected to the positive output terminals 25, 27 of the amplifier 20 respectively. The DC filter 30 is capable of filtering out DC signals from the amplified audio signals and outputting filtered audio signals via negative pins of the electrolytic capacitors C01, C02.

The earphone jack 40 includes a ground terminal 42, and two conductive terminals 44, 46. First ends of the conductive terminals 44, 46 are electrically connected to the negative pins of the two electrolytic capacitors C01, C02 respectively for receiving the filtered audio signals. Second ends of the conductive terminals 44, 46 electrically connect with the plug of the external earphone 300 upon its insertion into the earphone jack 40. As a result, the earphone jack 40 receives the filtered audio signals from DC filter 30 for outputting through the external earphone 300.

The detection circuit 50 includes a switch 52, a first resistor R1, a second resistor R2, a third resistor R3, a fourth resistor R4, and a power supply V1. The switch 52 includes two contacts 51, 53. First ends of the two contacts 51, 53 are connected with each other and a node A. Second ends of the two contacts 51, 53 are electrically connected to the first ends of the conductive terminals 44, 46 by default (when the plug of the external sound producer 300 is not electrically connected to the earphone jack 40) such that the switch 52 is in a closed state. The switch 52 is in an open state with contacts 51, 53 disconnected from the conductive terminals 44, 46 when the plug of the external earphone 300 is connected to the earphone jack 40. One end of the first resistor R1 is grounded and the other end of the resistor R1 is electrically connected to the negative pin of electrolytic capacitor C01 and the conductive terminal 44 of the earphone jack 40. One end of the second resistor R2 is grounded, and the other end of the second resistor R2 is electrically connected to the negative pin of the electrolytic capacitor C02 and the conductive terminal 46 of the earphone jack 40. A first end of third resistor R3 is electrically connected to the power supply V1, and the second end of the third resistor R3 is electrically connected to the node A. One end of the fourth resistor R4 is electrically connected to the node A, and the other end of the fourth resistor R4 is electrically connected to a node B. The node B is electrically connected to the volume adjustor 60. Accordingly, the third resistor R3 is electrically connected to the first resistor R1 and the second resistor R2 when the switch 50 is in closed state, and third resistor R3 is disconnected from the first resistor R1 and the second resistor R2 when the switch 50 is in open state. Here, the power supply V1 provides DC voltage of Vm, such as 5 V.

The internal sound producer 80 includes two speakers 80*a*, 80*b*. The speaker 80*a* is electrically connected between the positive output terminal 25 and the negative output terminal 26. The speaker 80*b* is electrically connected between the positive output terminal 27 and the negative output terminal 28.

When the earphone jack 40 receives the plug of the external earphone 300, the audio device 100 operates as follows.

The two contacts 51, 53 of the switch 52 are disconnected from the conductive terminals 44, 46 of the earphone jack 40 so that the switch 52 changes from closed to open state. The resistor R1 and the resistor R2 are disconnected from the resistor R3. The DC voltage provided by the power supply V1 is transmitted to the resistor R3 but not to the first resistor R1 and the second resistor R2. At this time, the voltage of the node A is a high voltage, as is that of the node B. The volume adjustor 60 receives the high voltage and then generates the first adjustment signal to transmit to the amplifier 20. The amplifier 20 adjusts the volume of the amplified audio signals according to the first predetermined volume levels in response to the first adjustment signal. The adjusted audio signals are then transmitted to the speakers 80*a*, 80*b* with both of the adjusted audio signals via the positive terminals 25, 27 and the adjusted audio signals via negative output terminals 26, 28 are in normal phase. The amplified audio signals from the positive output terminals 25, 27 can counteract the amplified audio signals from the negative output terminals 26, 28 to disable the speaker 80*a*, 80*b*. The external earphone 300 receives the adjusted audio signals from the positive terminals 25, 27 and then converts the audio signal to audible sound. Because the first predetermined volume levels are suitable for the external earphone 300, the external earphone 300 can output sound at a desired level.

When the earphone jack 40 does not receive the plug of the external earphone 300, the audio device operates as follows.

The two contacts 51, 53 of the switch 52 are connected to the conductive terminals 44, 46 of the earphone jack 40 respectively. The DC voltage provided by the power supply V1 is transmitted to the resistor R1, the resistor R2 and resistor R3. As a result, the voltage of the node B provided by the power supply V1 is the low voltage. The volume adjustor 60 receives the low voltage and generates the second adjustment signal to the amplifier 20. The amplifier 20 adjusts the volume of the amplifier audio signals according to the second predetermined volume levels in response to the second adjustment signal. The amplifier 20 then outputs adjusted audio signals in normal phase to the speaker 80*a*, 80*b* via the positive output terminals 25, 27 and outputs adjusted audio signals in reverse phase to the speaker 80*a*, 80*b* via the negative output terminals. The adjusted audio signals from the positive output terminals 25, 27 add to the adjusted audio signals from the negative output terminals 26, 28 to enable the speakers 80*a*, 80*b* to output audible sound. Because the second predetermined volume levels are suitable for the speaker 80*a*, 80*b*, the speaker 80*a*, 80*b* can output sound at a desired level.

Figure 3:
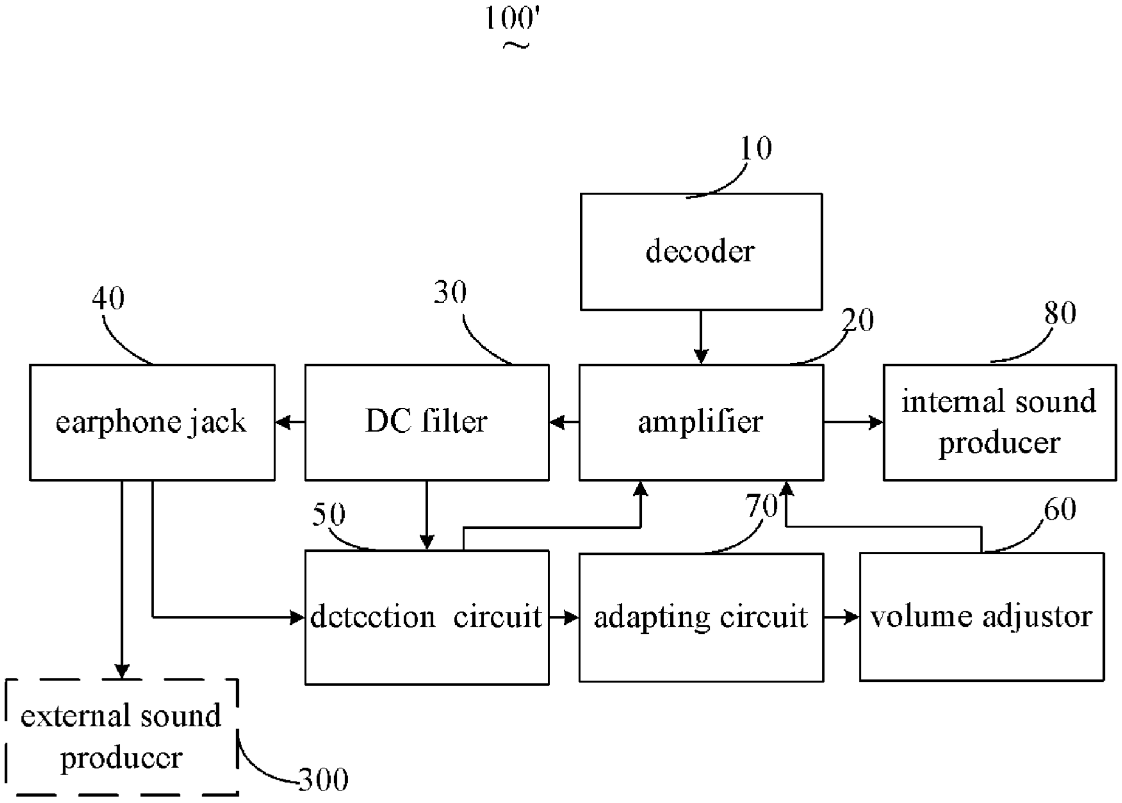
FIG. 3 is a block diagram of a second embodiment of an audio device.

FIG. 3 is a block diagram of a second embodiment of an audio device. The audio device 100' is similar to the audio device 100, However, the audio device 100' further includes an adapting circuit 70 connected between the detection circuit 50 and the volume adjustor 60 for converting the first state signal and the second state signal to a voltage level adaptable to the volume adjustor 60.

Figure 4:
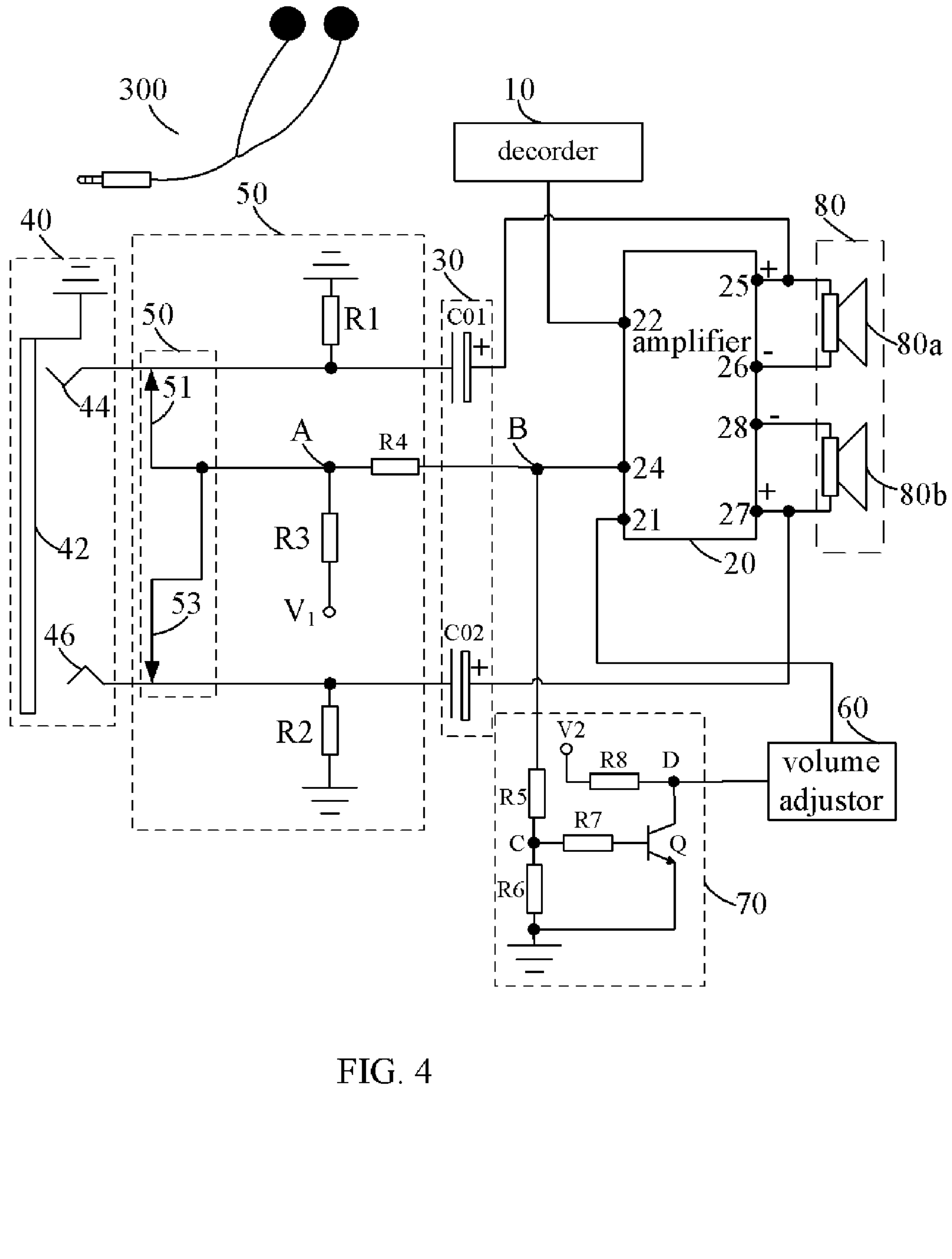
FIG. 4 shows a second embodiment of a volume circuit for an audio device, such as, for example, that of FIG. 3.

Referring to FIG. 4, the adapting circuit 70 includes a voltage supply V2, a fifth resistor R5, a sixth resistor R6, a seventh resistor R7, an eighth resistor R8, and a bipolar junction transistor Q. One end of the fifth resistor R5 is electrically connected to the node B, the other end of the fifth resistor R5 is electrically connected to a node C. One end of the sixth resistor R6 is electrically connected to node C and the other end is grounded. A node D is electrically connected to the voltage supply V2 via the eighth resistor R8. The base of the bipolar junction transistor Q is electrically connected to the node C via the seventh resistor R7, the collector of the bipolar junction transistor Q is electrically connected to the node D, and the emitter of the bipolar junction transistor Q is grounded. The node D is further electrically connected to the volume adjustor 60. The voltage supply V2 provides a voltage with 5V As a result, when the node B is at the high voltage, the base voltage is high, the bipolar junction transistor Q thus turns on, the node D is at a low voltage of 0V, the volume adjustor 60 receives the low voltage to generate the first adjustment signal. When the node B is at the low voltage, the base voltage is low, the bipolar junction transistor Q thus turns off, the node D is at a high voltage of 5V, the volume adjustor 60 receives the high voltage to generate the second adjustment signal.

As described, the audio device outputs sound by the internal speaker and the external earphone using different predetermined volume levels, such that target volume levels are easily achieved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An audio device comprising:

an internal sound producer;

an earphone jack for establishing a connection with an external sound producer;

a detection circuit for detecting a connection between the earphone jack and the external sound producer, and generating a first state signal when the connection is detected and a second state signal when no connection is detected;

a volume adjustor preset with first predetermined volume levels suitable for the external sound producer and second predetermined volume levels suitable for the internal sound producer, the volume adjustor generating a first adjustment signal based on the first predetermined volume levels in response to the first state signal, and generating a second adjustment signal based on the second predetermined volume levels in response to the second state signal; and an amplifier electrically connected with the volume adjustor, the internal sound producer, and the earphone jack, the amplifier receiving audio signals, amplifying the audio signals, and adjusting volume of the amplified audio signals according to the adjustment signals, then outputting the adjusted audio signals to the internal sound producer and the earphone jack; wherein each of the first predetermined volume levels and the second predetermined volume levels indicates an adjustable volume range, each of the first predetermined volume levels corresponds to one of the second predetermined volume levels, the first predetermined volume level is lower than the corresponding second predetermined volume level, the amplifier comprises a positive output terminal and a negative output terminal, the internal sound producer is connected with the amplifier via the positive output terminal and the negative output terminal, the adjusted audio signals are output to the internal sound producer via the positive output terminal and the adjusted audio signals output to the internal sound producer via the negative output terminal are in phase when the amplifier receives the first state signal, and the adjusted audio signals output to the internal sound producer via the positive output terminal and the adjusted audio signals output to the internal sound producer via the negative output terminal are out of phase when the amplifier receives the second state signal.

2. The audio device of claim 1, wherein the volume adjustor selects one of the first predetermined volume levels to generate the first adjustment signal based on the selected volume level when receiving the first state signal, and selects one of the second predetermined volume levels to generate the second adjustment signal based on the selected volume level when receiving the second state signal.

3. The audio device of claim 1, wherein the detection circuit comprises a switch and a first resistor, a second resistor, a third resistor, and a power supply, the switch is in open state when the connection is detected, and the switch is in closed state when no connection is detected, the power supply provides a DC voltage, the DC voltage is transmitted to the first resistor, the second resistor and the third resistor when the switch is in closed state such that the detection circuit generates the first state signal, and the DC voltage is transmitted to the first resistor but not to the second resistor and the third resistor when the switch is in closed state such that the detection circuit generates the second state signal.

4. The audio device of claim 3, further comprising a direct current (DC) filter filtering out noise from the amplified audio signals before the amplified audio signals are transmitted to the earphone jack.

5. The audio device of claim 4, wherein the DC filter has two electrolytic capacitors, the positive pins are electrically connected to the amplifier, the electrolytic capacitors receive the amplified audio signals via the positive pins and output the filtered audio signals via the negative pins.

6. The audio device of claim 5, wherein the earphone jack comprises two conductive terminals, the switch comprises two contacts, first ends of the two contacts are connected to a first node, second ends of the two contacts electrically connect to the two conductive terminals respectively such that the switch is in the closed state when no connection is detected, and disconnected from the conductive terminals such that the switch is in open state when the connection is detected.

7. The audio device of claim 6, wherein first ends of the first resistor and the second resistor are grounded and the other ends are electrically connected to the negative pin of one of the electrolytic capacitors and the conductive terminal of the earphone jack respectively, a first end of the third resistor is electrically connected to the power supply and the second end of the third resistor is electrically connected to the first node, and the first node is electrically connected to the volume adjustor.

8. The audio device of claim 1, further comprising an adapting circuit electrically connected between the detection circuit and the volume circuit for converting the first state signal and the second state signal to voltage levels suitable for the volume adjustor.

9. The audio device of claim 8, wherein the adapting circuit includes a power supply, a bipolar junction transistor, and a first resistor, the base of the bipolar junction transistor is electrically connected to the detection circuit, the collector of the bipolar junction transistor is electrically connected to the power supply via the first resistor, and the emitter of the bipolar junction transistor is grounded, a first node is connected between the power supply and the collector of the bipolar junction transistor, the first node is further electrically connected to the volume adjustor.

10. The audio device of claim 9, wherein the adapting circuit further comprises a second resistor, a third resistor, and a forth resistor, one end of the second resistor is electrically connected to the detection circuit and the other end to a second node, one end of the third resistor is electrically the third node, the other end of the third resistor is grounded, and the base of the bipolar junction transistor is electrically connected to the third node via the forth resistor.

11. An audio device comprising an earphone jack for detachably connecting an external sound producer, and capable of generating a first state signal and a second state signal, the audio device comprising:

an internal sound producer;

a volume adjustor preset with first predetermined volume levels suitable for the external sound producer and second predetermined volume levels suitable for the internal sound producer, receiving the first state signal and the second state signal, a volume adjustor further generating a first adjustment signal based on the first predetermined volume levels when receiving the first state signal, and generating a second adjustment signal based on the second predetermined volume levels when receiving the second state signal; and an amplifier electrically connected with the volume adjustor, the internal sound producer, and the earphone jack, the amplifier receiving audio signals, amplifying the audio signals, and adjusting volume of the amplified audio signals according to the adjustment signals, then outputting the adjusted audio signals to the internal sound producer and the earphone jack; wherein each of the first predetermined volume levels and the second predetermined volume levels indicates an adjustable volume range, each of the first predetermined volume levels corresponds to one of the second predetermined volume levels, and the first predetermined volume level is lower than the corresponding second predetermined volume level, the volume adjustor selects one of the first predetermined volume levels to generate the first adjustment signal based on the selected volume level when receiving the first state signal, and selects one of the second predetermined volume levels to generate the second adjustment signal based on the selected volume level when receiving the second state signal, the first state signal is a high voltage, and the second state signal is a low voltage, the audio device further comprises an adapting circuit connected between the detection circuit and the volume circuit for converting the first state signal and the second state signal to voltage levels suitable for the volume adjustor, the adapting circuit includes a power supply, a bipolar junction transistor, and a resistor, the base of the bipolar junction transistor is electrically connected to the detection circuit, the collector of the bipolar junction transistor is electrically connected to the power supply via the resistor, and the emitter of the bipolar junction transistor is grounded, a first node is connected between the power supply and the collector of the bipolar junction transistor, the first node is further electrically connected to the volume adjustor.

* * * * *